(12) United States Patent
Liaw (10) Patent No.: US 6,569,723 B2
(45) Date of Patent: May 27, 2003

(54) CROSSED STRAPPED VSS LAYOUT FOR FULL CMOS SRAM CELL

(75) Inventor: Jhon-Jhy Liaw, Taipei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/147,222

(22) Filed: May 16, 2002

(65) Prior Publication Data

US 2002/0127786 A1 Sep. 12, 2002

Related U.S. Application Data

(62) Division of application No. 09/547,235, filed on Apr. 11, 2000.

(51) Int. Cl.[7] .......................... H01L 21/00; H01L 21/84
(52) U.S. Cl. ....................................... 438/153; 438/238
(58) Field of Search ................................ 438/153, 154, 438/199, 200, 202, 238, 586

(56) References Cited

U.S. PATENT DOCUMENTS 6,376,297 B1 * 4/2002 Porter et al.

* cited by examiner

*Primary Examiner*—David Nelms
*Assistant Examiner*—Phuc T. Dang
(74) *Attorney, Agent, or Firm*—George O. Saile; Stephen B. Ackerman; Graham S. Jones (57) ABSTRACT

This method forms an SRAM device with an array of cells having low resistance conductors for the reference potential (Vss) circuits connected to transistors in the SRAM device. First form an SRAM device with two pull-up transistors, two pull-down transistors and two pass gate transistors, including thin film gate electrode conductors and interconnection lines, each of the transistors having a drain region and a source region with source regions of the two pull-up transistors connected to a power supply voltage (Vcc). Then form a plurality of dielectric and metallization layers over the transistors, the conductors and the interconnection lines. Form a stack of layers over the transistors, the stack of layers comprising a plurality of metallization layers sandwiched between a plurality of dielectric layers. Form a conductive reference potential node electrically connected to the source region of each of the pull-down transistors. Form a first Vss strap/conductor in a first direction in a first one of the metallization layers. Form a second Vss strap/conductor in a second direction in a second one of the metallization layers. Form a VIA/contact between the conductive reference potential node and the first and second Vss strap conductors.

12 Claims, 8 Drawing Sheets

CROSSED STRAPPED VSS LAYOUT FOR FULL CMOS SRAM CELL

This is a division of patent application Ser. No. 09/547,235, filing date Apr. 11, 2000, Method Of Forming Cross Strapped Vss Layout For Full Cmos Sram Cell And Device Produced Thereby

BACKGROUND OF THE INVENTION

1. Field of the Invention

This invention relates to semiconductor memory devices and more particularly to CMOS Static RAM (SRAM) integrated circuit devices.

2. Description of Related Art

U.S. Pat. No. 5,831,315 of Kengeri et al. for "Highly integrated low voltage SRAM array with low resistance Vss lines" shows an SRAM array configuration with SRAM cells arranged in rows and columns. Word lines and Vss connections are strapped by an array of word line straps and an array of Vss straps formed from the same layer. The word lines, the Vss straps, the rows and a shared power supply member are all disposed in a first direction. Cell rows are each driven by a particular word line. Cell row pairs are supplied with a low power supply voltage Vss by several Vss connections parallel to the cell rows. The word line straps and Vss straps are offset with respect to their associated word lines and Vss connections, respectively. The Vss strap offset is made by use of a Vss line that makes contact with the Vss connections and further includes landing portions which extend in the column direction and make contact with the Vss straps.

U.S. Pat. No. 5,589,415 of Blanchard for a "Method for Forming a Semiconductor Structure with Self-aligned Contacts" shows an SRAM layout. Local interconnect structures and processes use dual-doped polysilicon. A single implant dopes part of the polysilicon local interconnect layer p-type, and also diffuses through the polysilicon interconnect layer to enhance the doping of the PMOS drain regions, and also (optionally) adds to the doping of the PMOS source regions to provide source/drain asymmetry. The polysilicon interconnect layer is clad to reduce its conductivity, optionally with patterned rather than global cladding so that the diode can be used as a load element if desired.

U.S. Pat. No. 5,745,404, of Lien et al. for an "ISRAM Layout and Structure" shows an SRAM with an upper polysilicon layer forming a strapping via. A triple-polysilicon process forms an SRAM which has a compact four-transistor SRAM cell layout. The cell layout divides structures among the three layers of polysilicon to reduce the area required for each cell. Additionally, a contact between a pull-up resistor formed in an upper polysilicon layer forms a "strapping" via which cross-couples a gate region and a drain region underlying the strapping via. Pull-up resistors extend across boundaries of cell areas to increase the length and resistance of the pull-up resistors.

Integrated circuit (IC) memory devices are made up of a plurality of memory cells. In general, one basic memory cell design is duplicated numerous times to form those cells. The basic cell design may be modified slightly from cell to cell, for example one cell may be a reversed image or complement of an adjacent cell, but the entire memory device can be described according to the basic cell design.

In the case of Static Random Access Memory (SRAM) devices, the basic cell is usually in one of two forms, either a six transistor (6T) cell or four transistor/two resistor (4T/2R) cell. Many conventional SRAMs using a 6T configuration have six transistors formed in a bulk semiconductor substrate such as single crystal silicon. That type of SRAM is usually embodied in a Complementary Metal Oxide Semiconductor (CMOS) technology, with four transistors being N-channel devices while the remaining two transistors are P-channel devices. A 6T SRAM device operates at relatively low power levels and the bulk transistors have good electrical characteristics, including high mobility and low threshold voltages. Also 6T SRAMs are relatively stable, having high immunity to cell errors, such as those caused by incident alpha particles. However, 6T SRAM cells formed of transistors in a bulk substrate require a large area because the transistors are formed next to one another in the substrate and are essentially in the same plane; which use of six bulk transistors imposes an undesirable lower limit on the cell size. Achieving the smallest cell size with the simplest process reduces the manufacturing costs, increases memory capacity, and increases the device performance without increasing the overall device size.

SUMMARY OF THE INVENTION

The invention teaches a cross Vss strapped layout for a SRAM cell.

An object of this invention is to avoid affecting other cells if one cell is shorted to the power supply voltage Vcc line or the bit line which affects the ground Vss of many other cells in a conventional array.

This method of this invention forms the SRAM device of this invention with an array of cells having low resistance conductors for the reference potential (Vss) circuits connected to transistors in the SRAM device. First form an SRAM device with two pull-up transistors, two pull-down transistors and two pass gate transistors, including thin film gate electrode conductors and interconnection lines, each of the transistors having a drain region and a source region with source regions of the two pull-up transistors connected to a power supply voltage line (Vcc). Then form a plurality of dielectric and metallization layers over the transistors, the conductors and the interconnection lines. Form a stack of layers over the transistors, the stack of layers comprising a plurality of metallization layers sandwiched between a plurality of dielectric layers. Form a conductive reference potential node electrically connected to the source region of each of the pull-down transistors. Form a first Vss strap/conductor in a first direction in a first one of the metallization layers. Form a second Vss strap/conductor in a second direction in a second one of the metallization layers. Form a VIA/contact between the conductive reference potential node and the first and second Vss strap/conductors. Preferably, the plurality of metallization layers are sandwiched between a plurality of dielectric layers includes a first (M1) metallization layer, a second (M2) metallization layer, and a third (M3) metallization layer. The M1 layer provides cell local interconnect to connect to drain regions of pull-up and pull-down transistor. The M1 layer provides conductors for connecting to power supply voltage line Vcc and to the reference potential line Vss. The M2 layer includes conductors providing power supply voltage Vcc and Vss low resistance straps oriented in the second direction adapted for global connection to every cell. The M2 layer provides a word line strapping conductor (M2B) oriented in the second direction. The M3 layer provides a Vss low resistance vertical conduction strap oriented in the first direction adapted for global connection to every cell. The M3 layer provides bit line conductors oriented in the first direction adapted for connection to every cell.

BRIEF DESCRIPTION OF THE DRAWINGS

The aforesaid and other aspects and advantages of this invention are explained and described below with reference to the accompanying drawings, in which.

DESCRIPTION OF THE PREFERRED EMBODIMENT

Full CMOS SRAMs have been exploited as ultra-high speed or ultra-low power memory devices. For maximum density to be achieve in memory devices, the cells must be laid out with as small a size as possible. As cells become smaller, SRAM designs using a tighter metal rule as Vss, power supply voltage Vcc and intra-cell local interconnects are being used. Smaller metal lines are being used while resistance grows larger which presents the problem addressed by this invention.

Figure 1:
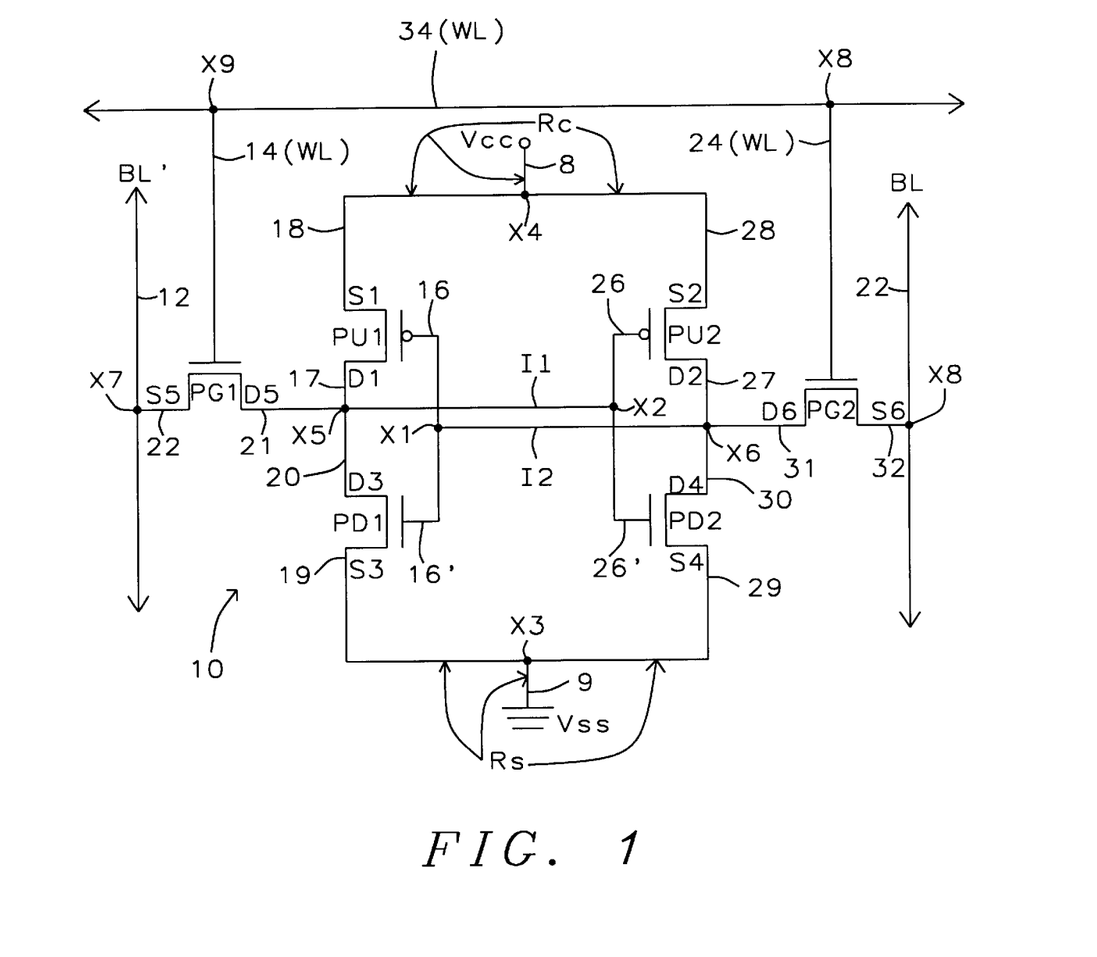
FIG. 1 shows a circuit diagram of a six transistor (6T) Static Random Access Memory (SRAM) cell in accordance with this invention.

FIG. 1 shows a circuit diagram of a six transistor (6T) Static Random Access Memory (SRAM) cell 10 in accordance with this invention.

Our studies of the circuit of FIG. 1 show that there have been excessively high series electrical resistances of lines 8, 18 and 28 which are connected to power supply voltage line Vcc. On the other hand ground connection lines 9, 19 and 29 which are connected to reference potential Vss have caused unacceptable voltage drops. These would be substantial disadvantages of the circuit of FIG. 1 implemented with the contemporary scale of SRAM devices in the absence of employment of strap lines in accordance with this invention.

The P+ doped polysilicon lines 8, 18 and 28 from the source power supply voltage Vcc to the sources S1 and S2 and the P+ doped lines 7, 17 and 27 from drain D1 and drain D2 to nodes at contact X5 and contact X6 respectively have substantial amounts of series electrical resistance.

Therefore, in the current scale of SRAM devices, referring to FIG. 1, the power supply voltage Vcc metal lines 8, 18 and 28, which are now smaller in cross sectional area, are a significant fraction of total resistance (Rc) to power supply voltage Vcc. The ground potential Vss metal lines 9, 19 and 29, which are also now smaller in cross sectional area, are a significant fraction of total resistance (Rs) in the regions of a cell through which the ground connection voltage Vss is supplied. When there is a higher resistance Rs the ground connection voltage Vss increases because of the IR drop across the ground connection resistance Rs. Likewise when there is a higher resistance Rc in the power supply circuit there is an increased IR drop across the power supply circuit resistance Rc. The result of these IR drops across the resistances Rs and Rc is that the cell will either be unstable or there is a decrease in the cell noise margin. Thus, it is important to find ways to design an SRAM cell so that a smaller cell size can be obtained without degrading cell performance through provision of a set of rules for a tighter metallization layers M1 and/or M2 (for use as local interconnects).

Figure 2:
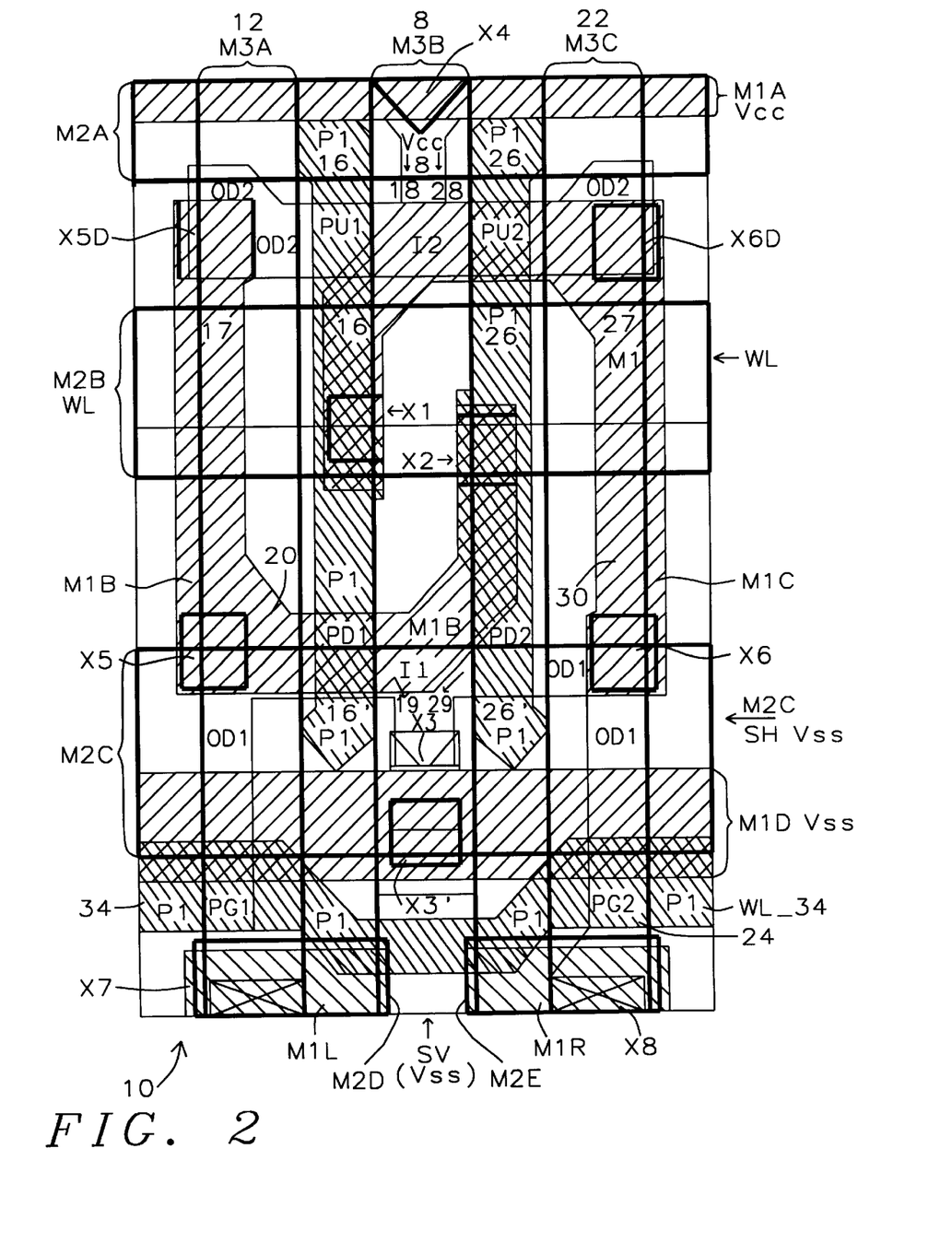
FIG. 2 is a plan view of the overall layout of a unit cell of the device of FIG. 1.

FIG. 2 is a plan view of the overall layout of a unit cell of the device of FIG. 1.

Figure 3:
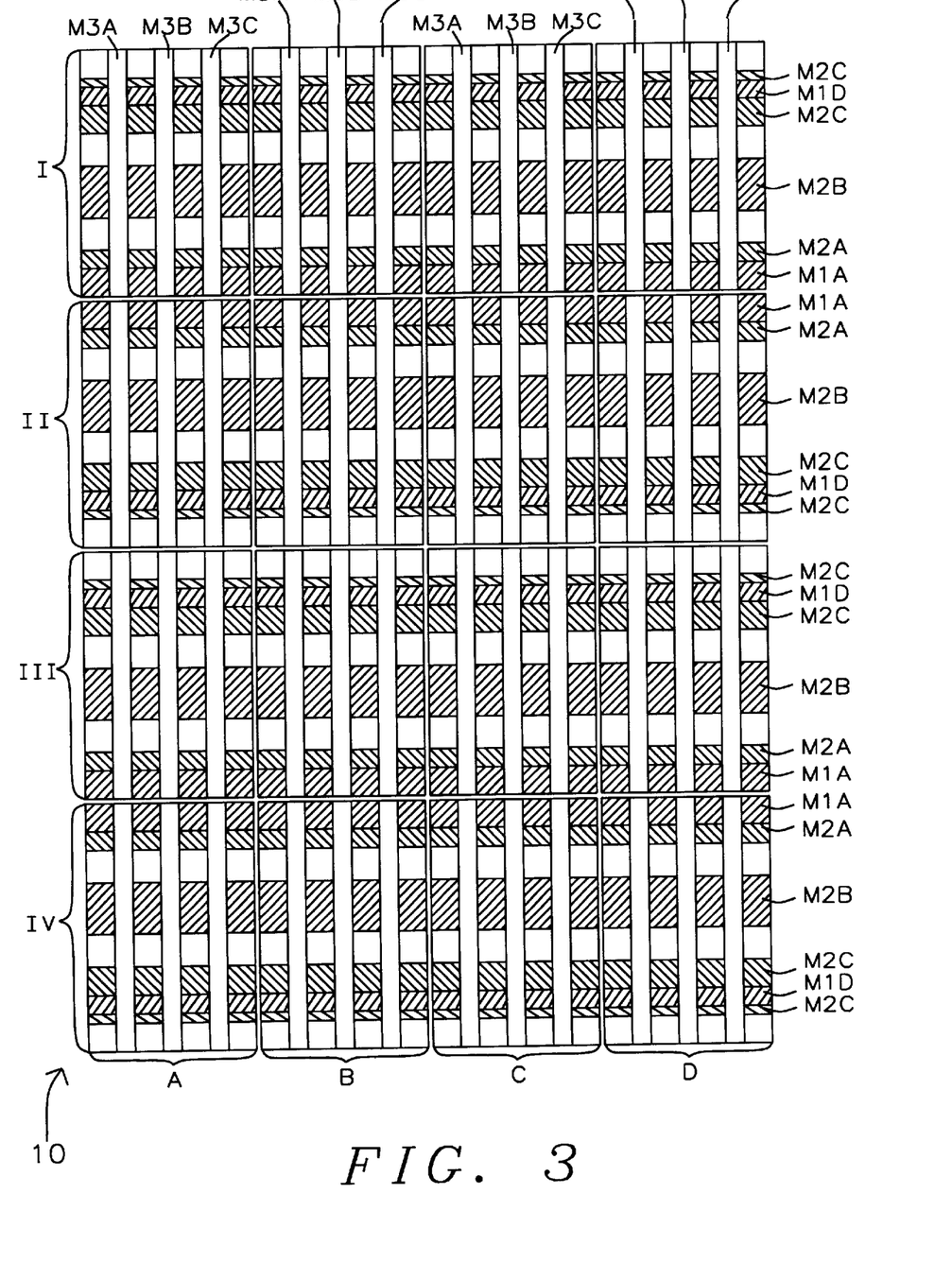
FIG. 3 is a plan view of the metallization layers of unit cells of the kind shown in FIG. 2.

FIG. 3 is a plan view of the metallization layers M1, M2 and M3 of 16 unit cells of the kind shown in FIG. 2.

Referring again to the circuit diagram of FIG. 1, the plan view of the SRAM cell 10 is described in detail below. FIG. 1 includes a first storage node at contact X5 and a second storage node at contact X6, a pair of pull-up (load) transistors PU1 and PU2 having their sources S1 and S2 (composed of P-doped silicon) connected through P+ doped polysilicon lines 18 and 28, respectively, to power supply voltage Vcc strapping line 8 which connects to the power supply voltage source Vcc. The drain regions D1 and D2 (composed of P-doped polysilicon) of pull-up (load) transistors PU1 and PU2 are connected through P+ doped polysilicon lines 17 and 27 to the nodes at contacts X5 and X6, where they are connected respectively to the outer ends of the N+ doped interconnection lines I1 and I2. The drain D3 of a first pull-down (latch) transistor PD1 is connected through line 20 to the contact X5. The drain D4 of the second pull-down (latch) transistor PD2 is connected through line 30 to the contact X6.

The gate electrodes for the first pull-down transistor PD1 and the first pull-up (load) transistor PU1 are connected through conductor lines 16/16' respectively through contact X1 and through interconnection line I2 to the contact X6. The gate electrode of second pull-down transistor PD2 and the gate electrode of second pull-up (load) transistor PU2 are connected through conductor lines 26/26' respectively through contact X2 and through interconnection line I1 to the contact X5. The gate electrodes of pass gate transistors PG1 and PG2 are connected through lines 14/24 and contacts X9/X8, respectively, to the word line 34 (WL).

The source regions S1/S2 of the pull-up (load) transistors PU1/PU2 respectively connect electrically through P+ doped polysilicon lines 18/28 through contact X4 X6 and Vcc strapping line 8 to power supply terminal (at voltage Vcc) and to each other.

Bit line 22 (BL), and line 32 connect through the source/drain circuit of second pass gate transistor PG2 to contact X6.

Complementary bit line 12 (BL' is connected through the source/drain circuit of first pass gate transistor PG1 to the contact X5.

The pass gate transistors PG1, PG2 and pull-down transistors PD1, PD2 are NMOS (N-channel) devices and the pull-up (load) transistors PU1, PU2 are PMOS (P-channel) devices.

Contact X5 connects through the interconnection line I1 and the conductor lines 26/26' to the gate electrodes of the second pull-down transistor PD2 and the second pull-up (load) transistor PU2.

Contact X6 connects through the interconnection line I2 and the conductor lines 16/16' to the gate electrodes of the first pull-down transistor PD1 and the first pull-up (load) transistor PU1.

Referring to FIG. 2, there are three layers of metallization M1, M2 and M3.

The M1 layer is shaded with diagonal hatching. The first portion of M1 layer is a horizontally disposed conductor M1A on the top of the drawing which is also Vcc strapping line 8 to the Vcc power source in FIG. 1.

A second conductor M1B of layer M1 is shown as a first reversed J-shaped conductor, which includes the conductor I1, that extends between contacts X2, X5, and X5D, centered on the left side of FIG. 2. Reversed J-shaped conductor M1B crosses over pull-down transistor PD1 and a portion of pull-down transistor PD2.

A third conductor M1C of layer M1 forms a second reversed J shaped conductor, which includes the conductor 12, is an 180 degree rotation of the first reversed J shape, which is shown extending between contact X1, X6, and X6D centered on the right side of FIG. 2. Reversed J-shaped conductor M1C crosses over pull-up transistor PU2 and a portion of pull-up transistor PU1.

Figure 9A:
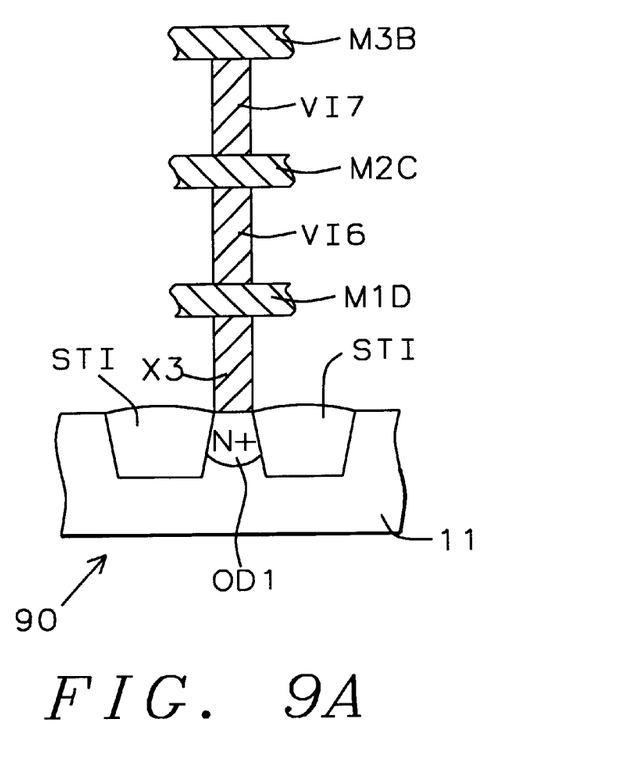
FIG. 9A shows a cross-sectional view of a via and contact stack adapted for connection to the ground potential Vss.

A fourth conductor M1D of the first metallization layer M1 comprises the horizontal ground potential Vss strap which crosses over contacts X3 and X3' for connection thereto. Contact X3' connects from metallization layer M1 at conductor M1D down to the first active area OD1 as seen in FIG. 9A. Contact X3 reaches up through a via VI6 to Vss horizontal conductor/strap M2C and is connected therefrom through via VI7 to the vertical Vss conductor/strap M3B.

Lines 19 and 29 are formed of a silicide layer composed of a material selected from the group consisting of cobalt silicide (CoSi2 and TiSi2). Line 19, which connects to the source S3 of pull-down transistor PD1, and line 29, which connects to the source S4 of pull-down transistor PD2, are shown above the location of node/contact X3.

A fifth conductor of layer M1 comprises lower left conductor M1L of layer M1, which is connected to provide a contact X7 to bit line BL'.

A sixth conductor of layer M1 comprises lower right conductor M1R of layer M1, which is connected to provide a contact X8 to bit line BL.

The second metallization layer M2 includes three horizontal bands M2A, M2B, and M2C which extend from the left edge to the right edge of the unit cell shown in FIG. 2, and beyond as seen in FIG. 3.

In FIG. 2, The top M2 band M2A is low resistance Vcc strapping line 8 connected by via-and-contact X4 to lines 18 and 28 which are composed of a silicide layer. Line 18 connects to the source S1 of pull-up transistor PU1. Line 28 connects to the source S2 of pull-up transistor PU2 as shown near the top center of FIG. 2 where they connect together at contact X4 to Vcc strapping line 8.

The second M2 band M2B comprises a horizontally oriented, wordline WL strap which connects by contact X9 to wordline conductor 14 and by contact X10 to wordline conductor 24. The fourth and fifth M2 regions M2D and M2E (which are portions of second (M2) metallization layer) are shown at the bottom of FIG. 2 over the contacts X7 and X8. There is the third metallization layer M3 which includes lines M3A (BL') and M3C (BL).

Wordline strap 34, which is shown extending horizontally across the lower portion of FIG. 2, connects to wordline conductors 14 and 24, which are connected to the gates of transistors PG1 and PG2 in FIG. 1 and which, as shown in FIG. 2, are formed from the first polysilicon layer. Wordline conductors 14 and 24 are low resistance connectors.

The third M2 band M2C comprises the horizontally oriented, ground potential Vss strap which connects by contact X3 to ground line conductors 19 and 29 which connect to the source regions of the pull-down transistors PD1 and PD2 respectively. Contact X3 connects by a VIAs dowm to ground potential Vss conductor/strap M1D and by a VIA up to vertical ground potential Vss strap M3B.

Finally there is a third metallization layer M3 that includes three vertical bands with bit line BL' M3A on the left, low resistance vertical strapping M3B in the center, and bit line BL M3C on the right. Metallization layers M3A, M3B, and M3C extend from the top to the bottom of the unit cell shown in FIG. 2. Bit line BL' layer M3A on the left reaches down through a contact X7 from layer M3A 12 down to the second active area OD2 at the source region S5 of the pass gate transistor PG1. Bit line BL layer M3C on the right reaches down through a contact X8 from layer M3C 22 down to the second active area OD2 reach the source region S6 of the pass gate transistor PG2.

Figure 7:
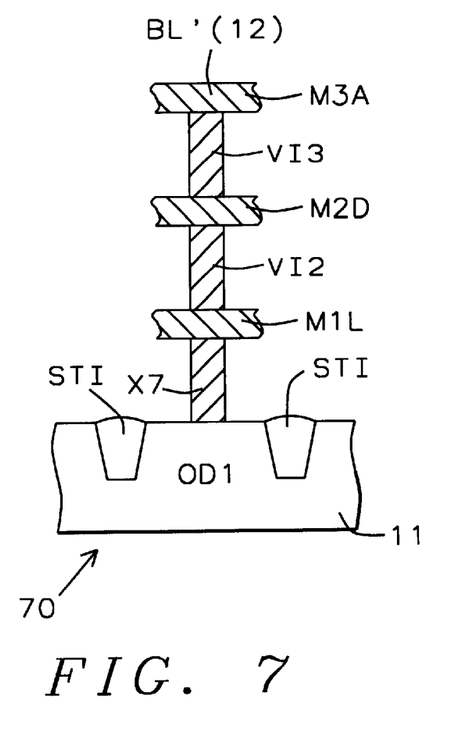
FIG. 7 shows a cross-sectional views of a via and contact stacks in accordance with this invention.

FIG. 7 shows a cross-sectional view of a via and contact stack 70 formed in dielectric layers removed for convenience of illustration. Contact X7 is formed on the active area OD1 in substrate 11. Active area OD1 is formed between shallow trench isolation (STI) trenches STI Contact X7 interconnects lower left conductor M1L and active area OD1. Via VI2 connects from lower left conductor M1L to fourth M2 region M2D. The via VI3 connects from fourth M2 region M2D to line M3A which forms bit line 12 (BL') in FIG. 1.

Figure 8:
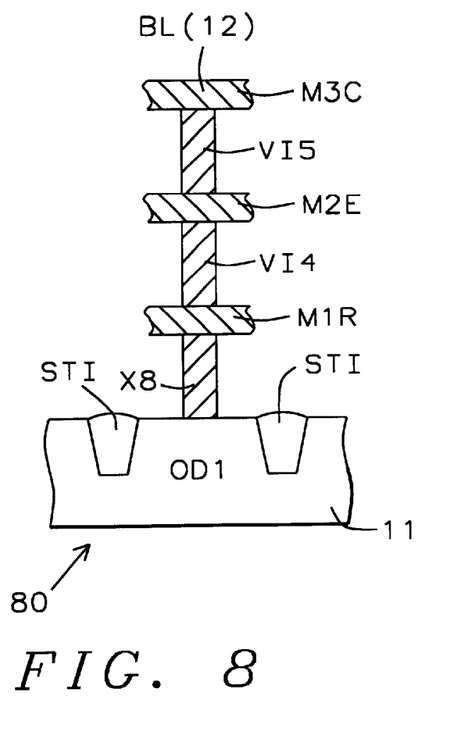
FIG. 8 shows another cross-sectional views of a via and contact stacks in accordance with this invention.

FIG. 8 shows a cross section which is basically identical to FIG. 7 and which is a cross-sectional view of a via and contact stack 80 formed in dielectric layers removed for convenience of illustration. Contact X8 is formed on another portion of the active area OD (in substrate 11) which is formed between shallow trench isolation (STI) trenches STI. Contact X8 interconnects lower left conductor M1R and active area OD1. Via VI4 connects from lower left conductor M1R to fourth M2 region M2E. The via VI5 connects from fourth M2 region M2E to line M3C which forms bit line 12 (BL) in FIG. 1.

Referring again to FIG. 2, areas of first polysilicon layer P1 are marked by dotted areas. The gate electrodes of the six transistors are formed by the dotted areas proximate to the transistors PU1, PU2, PD1, PD2, PG1 and PG2 which are marked in the center of the gate electrodes of the respective MOSFET transistors.

The source regions and drain regions of the six transistors are formed in the active area regions OD formed in the silicon as indicated in FIG. 2. A first active area region OD1 in the shape of an inverted U is shown in FIG. 2. The first active area region OD1 extends from the contact X7 up across transistor PG1, towards X5 which connects to the drains of transistors PG1, PD1, and PU1 and crosses under the gate of transistor PD1 across under the gate of transistor PD2, where it turns down at contact X6 which is connected to the drains of transistors PG2, PD2, and PU2 down across transistor PG2 down to contact X8. Between transistors PD1 and PD2, the active area reaches down to contact X3 which is connected to ground potential Vss. A second active area region OD2 extends from right to left from contact X5D to contact X6D passing under the gates of transistors PU1 and PU2 and up between transistors PU1 and PU2 to contact X4 connected to Vcc line strapping 8 which is connected to the voltage source Vcc through horizontally disposed M1 conductor M1A. The conductor M1A is located well below the vertical straps M3A, M3B and M3C and contact X4 is separated from vertical strap M3B by dielectric layers, as will be well understood by those skilled in the art.

FIG. 3 shows an array of sixteen unit cells formed with four vertical sets of columns A, B, C and D of unit cells vs. four sets of horizontal rows I, II, III and IV. The three vertical M3A, M3B and M3C straps are shown for all four sets of columns A, B, C and D in the same pattern. However, for the four sets of horizontal rows I, II, III and IV, the arrangement of the conductors/straps M1D, M2C, M2A and M1A of rows I are shown to be reversed in rows II as conductors/straps M1A, M2A, M2C, and M1D. The same reversal is shown for rows III and rows IV. In this way the conductors/straps M1A are proximate to each other for rows I/II and for rows III/IV.

Figure 4:
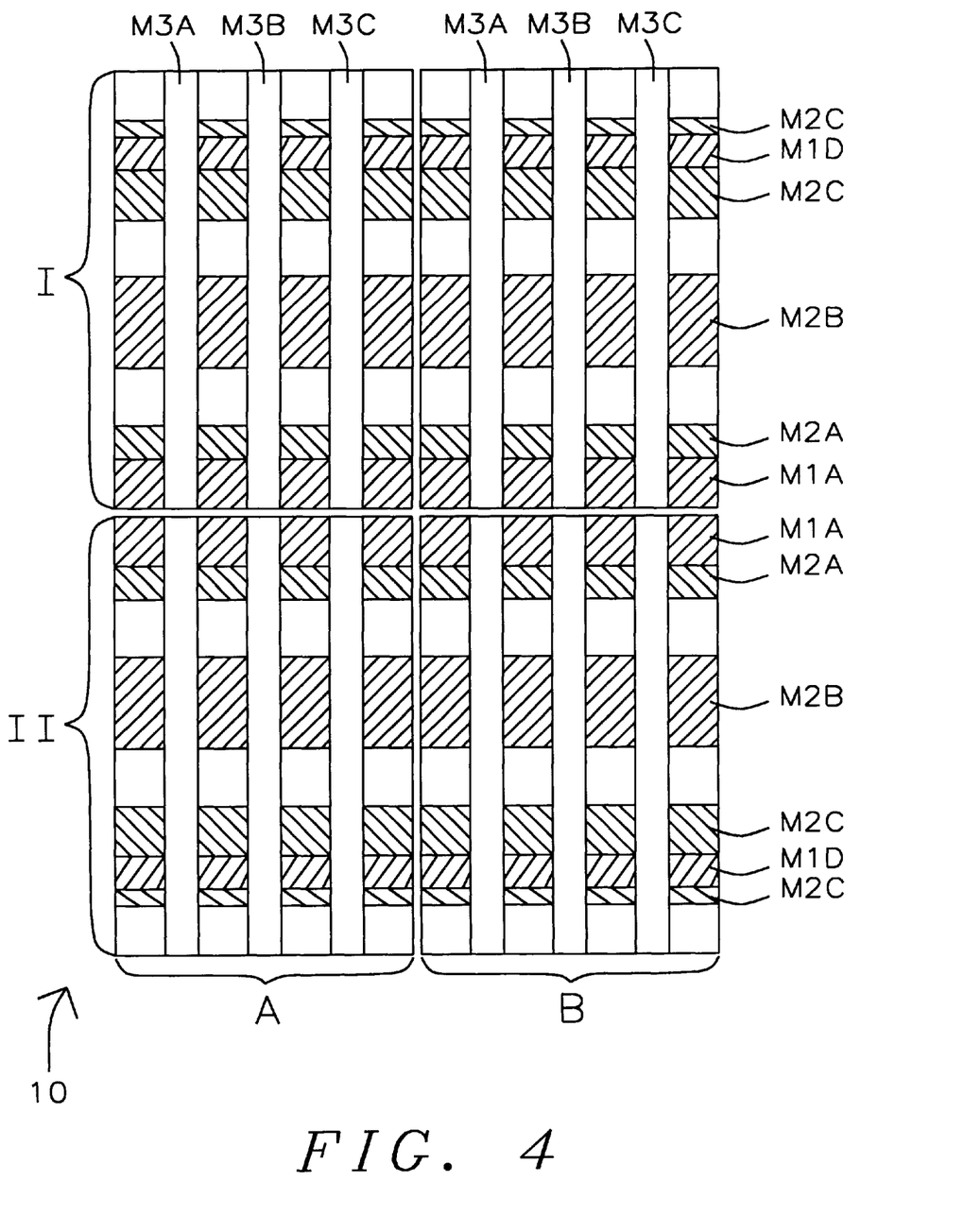
FIG. 4 shows an magnified view of the upper left corner of FIG. 3 with the first columns and A and B and the first two rows I and II shown.

FIG. 4 shows an magnified view of the upper left corner of FIG. 3 with the first two sets of columns and A and B and the first two sets of rows I and II shown.

What appears to be a separate row above conductor M1D at the top of FIG. 4 and another separate row below conductor M1D at the bottom of FIG. 4 are actually another portion of the two conductors M2C which portions have been omitted, for convenience of illustration, to show the conductor M1D which lies below the omitted portions.

Figure 5:
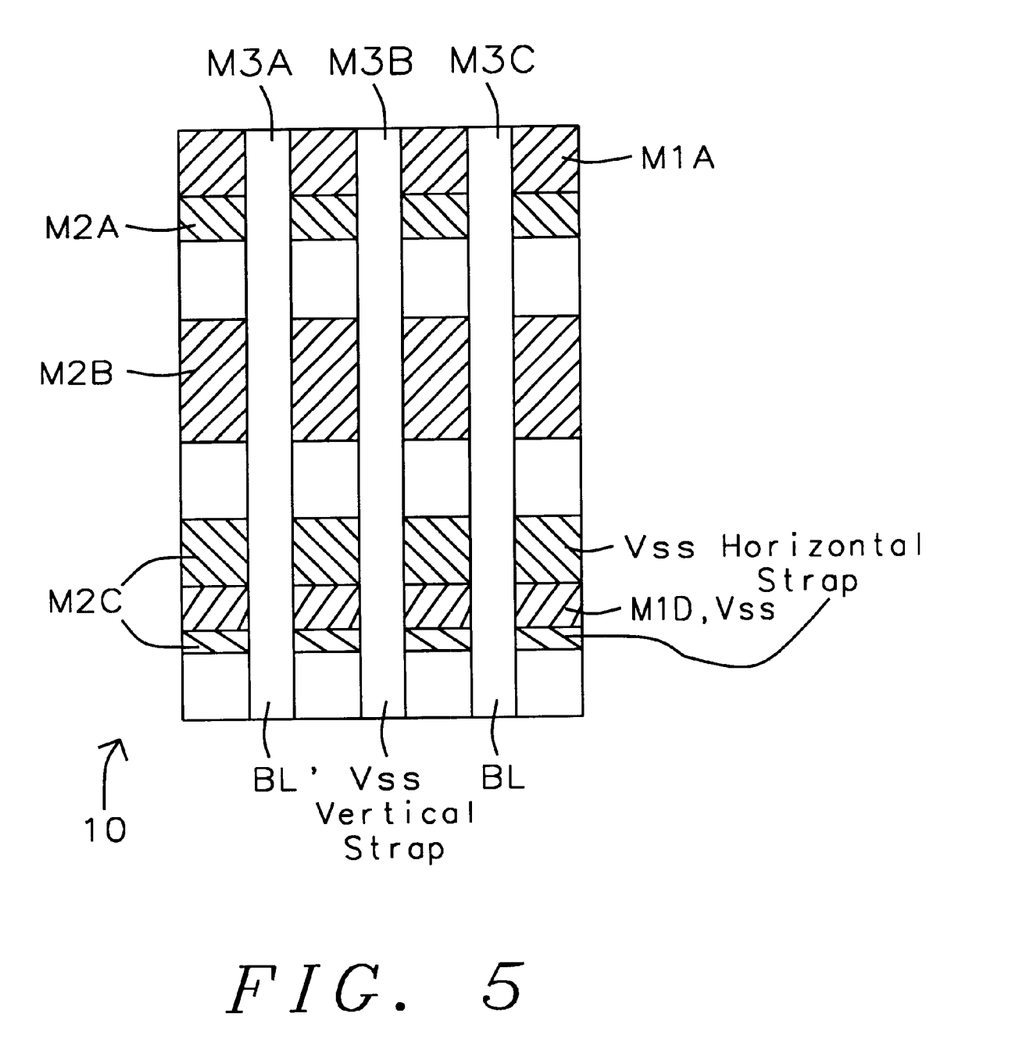
FIG. 5 shows a magnified view of the upper left corner of FIG. 4 with the first column A. and the first row I.

FIG. 5 shows a magnified view of the upper left corner of FIG. 4 with the first set of columns A and the first set of rows I. The ground potential Vss vertical strap M3B, ground potential Vss horizontal strap M2C, and ground potential Vss layer connector M1D are all shown.

Figure 6A:
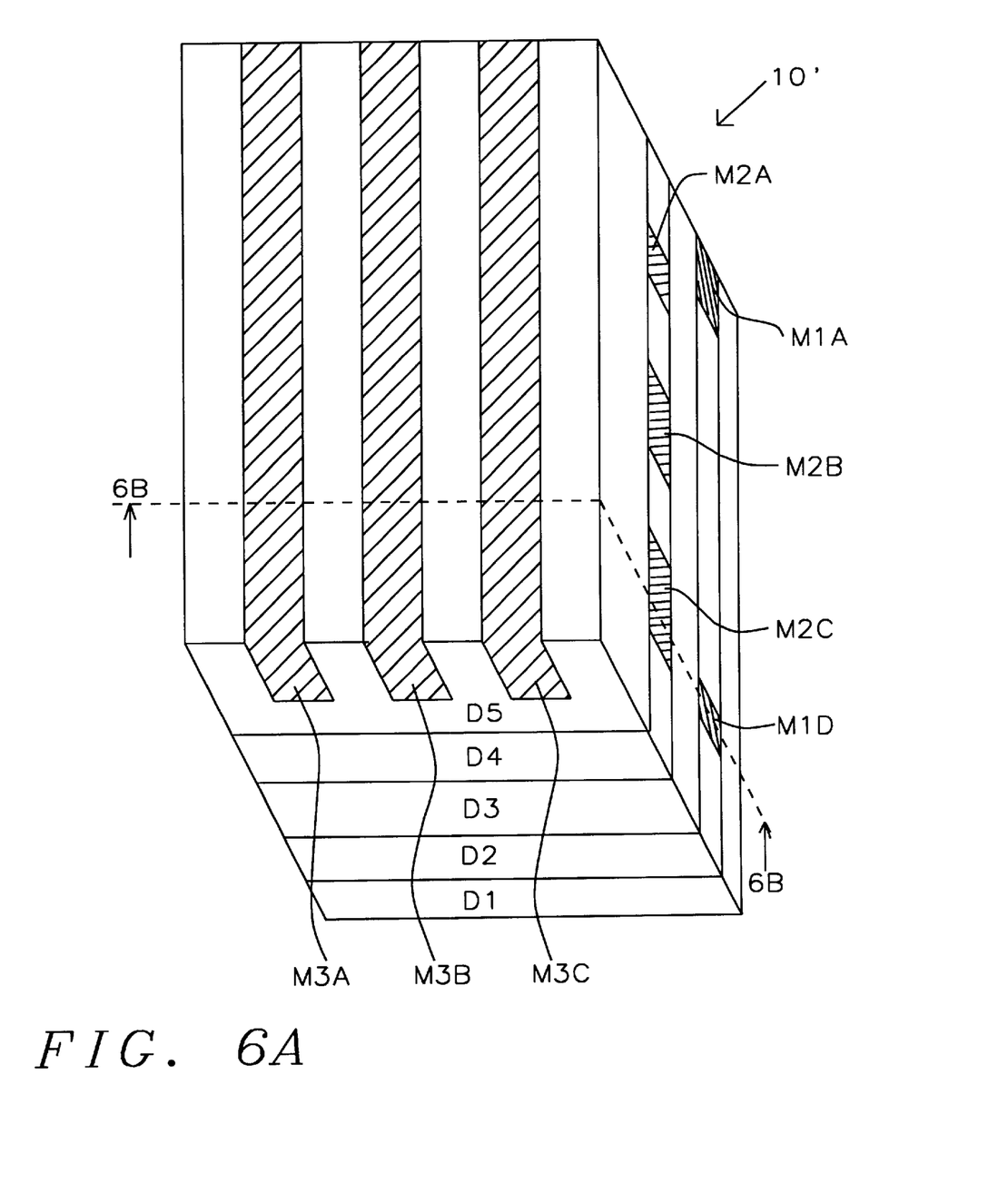
FIG. 6A shows an illustrative perspective view of the layers of metallization a device similar to the device of FIGS. 1–5.
Figure 6B:
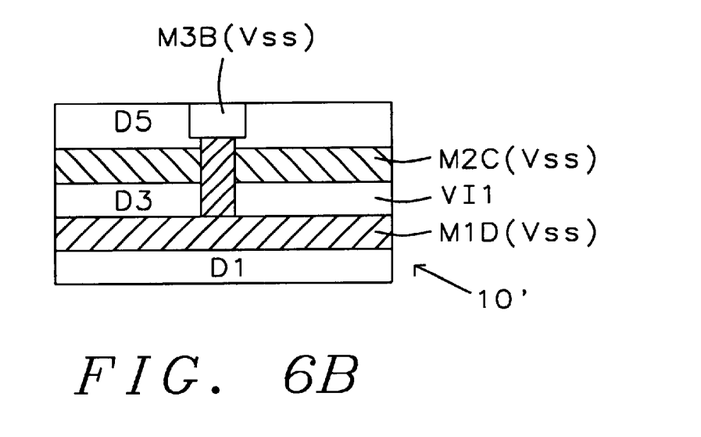
FIG. 6B is a section taken along the plane defined by lines 6B—6B in FIG. 6A.

FIG. 6A shows an illustrative perspective view of the layers of metallization a device 10' similar to the device 10 of FIGS. 1–5. FIG. 6B is a section taken along the plane defined by lines 6B—6B in FIG. 6A. There are connections between the third metallization M3 layer middle vertical strap M3B, the second metallization M2 layer lower horizontal strap M2C and the first metallization M1 layer section M1D connected as shown in sectional view in FIG. 6B.

In FIG. 6B, the sectional view shows an electrical connector VIA which forms a conductive bridge between vertical strap M3B (Vss), horizontal strap conductor (Vss) M2C, and horizontal conductor M1D (Vss) joining all three ground potential Vss ground connections together at with the low resistance electrical connection VIA. Referring to FIG. 6A, the conductors and the interlayer-connector VIA are separated from each other and supported by dielectric layers D1, D2, D3, D4 and D5. As can be seen electrical connector VIA passes up through dielectric layers D3, D4 and D5. Layer D4 can not be seen in the sectional view of FIG. 6B which is taken through the centers of lower horizontal strap M2C. The electrical connection VIA is performing the interlayer-connector function of the interlayer-connector/contact X3 in FIGS. 1 and 2.

Figure 9B:
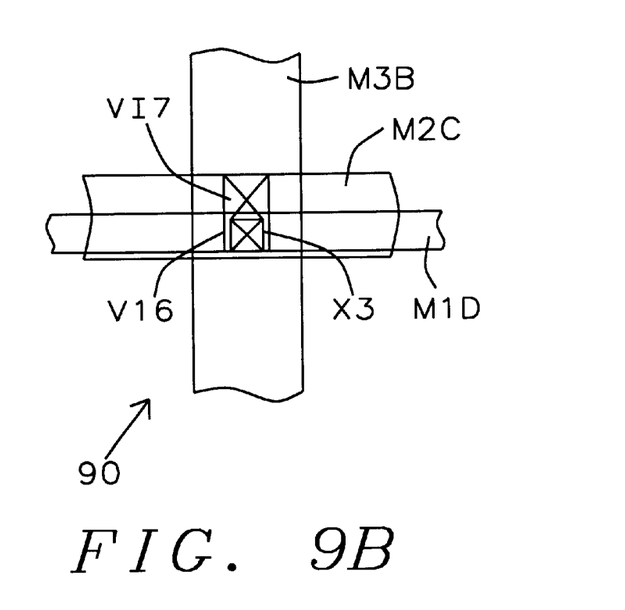
FIG. 9B shows a plan view of the via/contact stack of FIG. 9A.

FIG. 9A shows a cross-sectional view of a via and contact stack 90, for connection to ground potential Vss, formed in dielectric layers removed for convenience of illustration. Contact X3 is formed on the active area OD1 in substrate 11. Active area OD1 is formed between shallow trench isolation (STI) trenches STI. Contact X3 connects from the metallization layer M1 at conductor M1D down to the first active area OD1 as seen in FIG. 9A. Contact X3 reaches up through a via VI6 to ground potential Vss M2C. Contact X3 connects active area OD1 to the ground potential Vss horizontal conductor/strap strap formed from the fourth conductor M1D serving as the horizontal ground potential Vss strap. Horizontal ground potential Vss strap M1D is formed from the first metallization layer M1. A via VI6 connects from strap M1D to M2C to via VI7 to the vertical ground potential Vss conductor/strap M3B. FIG. 9B shows a plan view of The via/contact stack 90 of FIG. 9A.

The SRAM cell of this invention is designed to achieve a robust cell (smallest Vss & Vcc resistance) and improve yield or reduce cell failure bits. This invention uses ground potential Vss strapping in every cell.

SUMMARY

This provides an SRAM layout using cross ground potential Vss strapping in every cell as follows:

1. in the M1 layer, portions thereof are used as local interconnects to cells. Strap M1A makes connections through contact X4 and lines 18 and 28 to the drain regions of pull-up transistors PU1/PU2 and pull-down transistors PD1/PD2. The drain of pull-up transistor PU1 is connected via line 17 (M1B) and line 20 (M1A) to the drain of pull-down transistor PD1 and the drain of pull-up transistor PU2 is connected via line 27 (M1C) and line 30 (M1C) to the drain of pull-down transistor PD2 as shown in FIG. 1 and FIG. 2;
2. in the M1 layer, use conductor M1A by contact X4 and Vcc strapping line 8 to connect to the power supply voltage Vcc;
3. in the M1 layer, use conductor M1D and contact X3' and ground line 9 to connect to the ground potential Vss;
4. in the M2 layer, use conductor M2C as Vcc Vcc strapping line 8 for a low resistance horizontal conduction layer in every cell;
5. in the M2 layer, use conductor M2A and the lines 19 and 29 as ground potential Vss low resistance horizontal conduction layer in every cell;
6. use a portion of the M2 layer as a word line strapping conductor M2B;
7. in the M3 layer, use vertical strap conductor M3B as a ground potential Vss vertical strap, low resistance conductor for every cell;
8. in the M3 layer, use conductors M3A and M3C as bit lines.

With the present invention, if there is a short circuit to either the Vcc line or the bit line, the ground (Vss) of many other cells is unaffected because the ground (Vss) IR drop is minimized due to the reduced resistance in the ground (Vss) circuits.

PROBLEMS SOLVED

1. Reduction of total resistance of ground potential Vss and Vcc.
2. A more stable resistance of ground potential Vss and Vcc due for a multi-conductor and multi-contact device.
3. The cross Vss-strapping increases cell stability and improves the noise margin.
4. This cell improves yield and reduces cell failure bits.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. An SRAM device with an array of cells having low resistance conductors for the reference potential (Vss) circuits connected to transistors in the SRAM device comprising:

the SRAM device including two pull-up transistors, two pull-down transistors and two pass gate transistors, including thin film gate electrode conductors and interconnection lines, each of the transistors having a drain region and a source region with source regions of the two pull-up transistors connected to a power supply voltage (Vcc), a plurality of dielectric layers containing metal conductor lines and metallization layers over the transistors, the gate electrode conductors and the interconnection lines, a stack of layers over the transistors, the stack of layers comprising a plurality of metallization layers sandwiched between a plurality of dielectric layers, a conductive reference potential node electrically connected to the source region of each of the pull-down transistors, a first Vss strap/conductor in a first direction in a first one of the metallization layers, a second Vss strap/conductor in a second direction in a second one of the metallization layers, a VIA/contact between the conductive reference potential node and the first and second Vss strap/conductors, the plurality of metallization layers sandwiched between a plurality of dielectric layers includes a first (M1) metallization layer, a second (M2) metallization layer, and a third (M3) metallization layer, and the M2 layer provides a word line strapping conductor (M2B) oriented in the second direction.

2. The device of claim 1 wherein the M1 layer provides cell local interconnect to connect to drain regions of pull-up and pull-down transistor.

3. The device of claim 1 wherein the M1 layer provides conductors for connecting to Vcc and to Vss.

4. The device of claim 1 wherein the M2 layer includes conductors providing Vcc and Vss low resistance straps oriented in the second direction adapted for connection to every cell.

5. The device of claim 1 wherein the M3 layer provides a Vss low resistance vertical conduction strap oriented in the first direction adapted for connection to every cell.

6. The device of claim 1 wherein the M3 layer provides bit line conductors oriented in the first direction adapted for connection to every cell.

7. An SRAM device with an array of cells having low resistance conductors for the reference potential (Vss) circuits connected to transistors in the SRAM device comprising:

the SRAM device including two pull-up transistors, two pull-down transistors and two pass gate transistors, including thin film gate electrode conductors and interconnection lines, each of the transistors having a drain region and a source region with source regions of the two pull-up transistors connected to a power supply voltage (Vcc), a plurality of dielectric and metallization layers over the transistors, the conductors and the interconnection lines, a stack of layers over the transistors, the stack of layers comprising a plurality of metallization layers sandwiched between a plurality of dielectric layers, a conductive reference potential node electrically connected to the source region of each of the pull-down transistors, a first Vss strap/conductor in a first direction in a first one of the metallization layers, a second Vss strap/conductor in a second direction in a second one of the metallization layers, and a VIA/contact between the conductive reference potential node and the first and second Vss strap/conductors, the plurality of metallization layers sandwiched between a plurality of dielectric layers includes a first (M1) metallization layer, a second (M2) metallization layer, and a third (M3) metallization layer, and the M1 layer provides cell local interconnect to connect to drain regions of pull-up and pull-down transistor, and the M1 layer provides conductors for connecting to Vcc and to Vss.

8. The device of claim 7 wherein the M2 layer includes conductors providing Vcc and Vss low resistance straps oriented in the second direction adapted for connection to every cell.

9. The device of claim 8 wherein the M2 layer provides a word line strapping conductor (M2B) oriented in the second direction.

10. The device of claim 9 wherein the M3 layer provides a Vss low resistance vertical conduction strap oriented in the first direction adapted for connection to every cell.

11. The device of claim 10 wherein the M3 layer provides bit line conductors oriented in the first direction adapted for connection to every cell.

12. An SRAM device with an array of cells having low resistance conductors for the reference potential (Vss) circuits connected to transistors in the SRAM device comprising:

the SRAM device including two pull-up transistors, two pull-down transistors and two pass gate transistors, including thin film gate electrode conductors and interconnection lines, each of the transistors having a drain region and a source region with source regions of the two pull-up transistors connected to a power supply voltage (Vcc), a plurality of dielectric and metallization layers over the transistors, the conductors and the interconnection lines, a stack of layers over the transistors, the stack of layers comprising a plurality of metallization layers sandwiched between a plurality of dielectric layers, a conductive reference potential node electrically connected to the source region of each of the pull-down transistors, a first Vss strap/conductor in a first direction in a first one of the metallization layers, a second Vss strap/conductor in a second direction in a second one of the metallization layers, and a VIA/contact between the conductive reference potential node and the first and second Vss strap/conductors, the plurality of metallization layers is sandwiched between a plurality of dielectric layers includes a first (M1) metallization layer, a second (M2) metallization layer, and a third (M3) metallization layer, the M1 layer provides cell local interconnect to connect to drain regions of pull-up and pull-down transistor, and the M1 layer provides conductors for connecting to Vcc and to Vss, the M2 layer includes conductors providing Vcc and Vss low resistance straps oriented in the second direction adapted for global connection to every cell, the M2 layer provides a word line strapping conductor (M2B) oriented in the second direction, the M3 layer provides a Vss low resistance vertical conduction strap oriented in the first direction adapted for global connection to every cell, and the M3 layer provides bit line conductors oriented in the first direction adapted for connection to every cell.

* * * * *